United States Patent
Scheffer et al.

(10) Patent No.: US 7,827,519 B2
(45) Date of Patent: Nov. 2, 2010

(54) METHOD, SYSTEM, AND COMPUTER PROGRAM PRODUCT FOR PREPARING MULTIPLE LAYERS OF SEMICONDUCTOR SUBSTRATES FOR ELECTRONIC DESIGNS

(75) Inventors: Louis K. Scheffer, Campbell, CA (US); David White, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 418 days.

(21) Appl. No.: 11/866,385

(22) Filed: Oct. 2, 2007

(65) Prior Publication Data

US 2008/0163139 A1 Jul. 3, 2008

Related U.S. Application Data

(60) Provisional application No. 60/878,000, filed on Dec. 29, 2006.

(51) Int. Cl.
*G06F 17/50* (2006.01)
*G06F 9/45* (2006.01)
*G03C 3/00* (2006.01)
*G03C 5/00* (2006.01)

(52) U.S. Cl. ............. 716/19; 716/1; 716/2; 716/8; 716/10; 716/13; 430/14; 430/30

(58) Field of Classification Search .............. 716/1, 716/2, 4, 5, 8, 10, 13, 19
See application file for complete search history.

(56) References Cited

U.S. PATENT DOCUMENTS

| | | | |
|---|---|---|---|
| 6,892,364 B2 | 5/2005 | Baader et al. | |
| 6,952,688 B1 | 10/2005 | Goldman et al. | |
| 6,973,635 B2 * | 12/2005 | Happoya | 716/19 |
| 7,062,741 B1 | 6/2006 | Leng et al. | |
| 7,082,588 B2 * | 7/2006 | Scheffer et al. | 716/8 |
| 7,124,386 B2 | 10/2006 | Smith et al. | |
| 7,152,215 B2 | 12/2006 | Smith et al. | |
| 7,174,520 B2 | 2/2007 | White et al. | |
| 7,174,521 B2 | 2/2007 | Stine et al. | |
| 7,243,316 B2 | 7/2007 | White et al. | |

(Continued)

OTHER PUBLICATIONS

Notice of Allowance dated Jun. 2, 2010 for U.S. Appl. No. 11/866,370.

(Continued)

*Primary Examiner*—Helen Rossoshek
(74) *Attorney, Agent, or Firm*—Vista IP Law Group LLP

(57) ABSTRACT

Disclosed is an improved method, system, and computer program product for preparing multiple levels of semiconductor substrates for three-dimensional IC integration. Some embodiments utilize the process and design models to check and fabricate the insulating dielectric layer (IDL) separating the first and the second film stacks on separate substrates and then prepare the surface of the IDL to receive an additional layer of semiconductor substrate for further fabrication of the chips. Yet some other embodiments further employ the design and process models to ensure the IDL and the semiconductor substrate are sufficiently flat, or are otherwise satisfactory, so the three-dimensional integrated circuits meet the reliability, manufacturability, yield, or performance requirements. Yet some other embodiments further employ design and process models to place the vias connecting the multiple film stacks.

25 Claims, 8 Drawing Sheets

U.S. PATENT DOCUMENTS

| | | | |
|---|---|---|---|
| 7,254,798 B2 * | 8/2007 | Scheffer et al. | 716/11 |
| 7,260,810 B2 * | 8/2007 | Filippi et al. | 716/20 |
| 7,275,925 B2 * | 10/2007 | Farnworth | 425/174.4 |
| 7,289,867 B1 | 10/2007 | Markle et. Al. | |
| 7,302,672 B2 * | 11/2007 | Pack et al. | 716/19 |
| 7,325,206 B2 | 1/2008 | White et al. | |
| 7,353,475 B2 | 4/2008 | White et al. | |
| 7,356,783 B2 | 4/2008 | Smith et al. | |
| 7,360,179 B2 | 4/2008 | Smith et al. | |
| 7,363,099 B2 | 4/2008 | Smith et al. | |
| 7,363,598 B2 | 4/2008 | Smith et al. | |
| 7,367,008 B2 | 4/2008 | White et al. | |
| 7,373,627 B2 * | 5/2008 | Shigyo et al. | 716/13 |
| 7,380,220 B2 | 5/2008 | Smith et al. | |
| 7,383,521 B2 | 6/2008 | Smith et al. | |
| 7,392,496 B1 | 6/2008 | Schultz et al. | |
| 7,393,755 B2 | 7/2008 | Smith et al. | |
| 7,395,516 B2 * | 7/2008 | Fujimura et al. | 716/1 |
| 7,401,310 B1 | 7/2008 | Thaden et al. | |
| 7,409,327 B2 * | 8/2008 | Deliwala | 703/14 |
| 7,448,014 B2 | 11/2008 | Lavin et al. | |
| 7,451,411 B2 * | 11/2008 | Hau-Riege et al. | 716/2 |
| 7,526,748 B2 * | 4/2009 | Kotani et al. | 716/21 |
| 7,570,796 B2 | 8/2009 | Zafar et al. | |
| 7,627,837 B2 | 12/2009 | Zhang | |
| 7,676,077 B2 | 3/2010 | Kulkarni et al. | |
| 7,721,237 B2 | 5/2010 | Scheffer et al. | |
| 2003/0033041 A1 | 2/2003 | Richey | |
| 2003/0040175 A1 * | 2/2003 | Deliwala | 438/669 |
| 2003/0237064 A1 | 12/2003 | White et al. | |
| 2004/0210423 A1 | 10/2004 | Ashida et al. | |
| 2004/0243962 A1 | 12/2004 | Subasic et al. | |
| 2005/0037522 A1 | 2/2005 | Smith et al. | |
| 2005/0051809 A1 | 3/2005 | Smith et al. | |
| 2005/0076316 A1 | 4/2005 | Pierrat et al. | |
| 2005/0132306 A1 | 6/2005 | Smith et al. | |
| 2005/0188338 A1 | 8/2005 | Kroyan et al. | |
| 2005/0196964 A1 | 9/2005 | Smith et al. | |
| 2005/0235246 A1 | 10/2005 | Smith et al. | |
| 2005/0251771 A1 | 11/2005 | Robles | |
| 2005/0263722 A1 * | 12/2005 | Marrian et al. | 250/492.22 |
| 2005/0268256 A1 | 12/2005 | Tsai et al. | |
| 2006/0026544 A1 | 2/2006 | Engel et al. | |
| 2006/0085772 A1 | 4/2006 | Zhang | |
| 2006/0265679 A1 * | 11/2006 | Scheffer et al. | 716/8 |
| 2007/0089078 A1 | 4/2007 | Engel et al. | |
| 2007/0101301 A1 * | 5/2007 | Miyata | 716/1 |
| 2007/0101305 A1 | 5/2007 | Smith et al. | |
| 2007/0114396 A1 * | 5/2007 | Tohyama | 250/307 |
| 2007/0119616 A1 * | 5/2007 | Horikawa et al. | 174/250 |
| 2007/0256039 A1 | 11/2007 | White | |
| 2007/0266364 A1 * | 11/2007 | Pack et al. | 716/20 |
| 2007/0283298 A1 * | 12/2007 | Bernstein et al. | 716/1 |
| 2008/0027698 A1 | 1/2008 | White | |
| 2008/0034335 A1 * | 2/2008 | Cheng et al. | 716/5 |
| 2008/0148216 A1 * | 6/2008 | Chan et al. | 716/19 |
| 2008/0160646 A1 | 7/2008 | White et al. | |
| 2008/0162103 A1 | 7/2008 | White et al. | |
| 2008/0163139 A1 | 7/2008 | Scheffer et al. | |
| 2008/0163141 A1 | 7/2008 | Scheffer et al. | |
| 2008/0163142 A1 | 7/2008 | White et al. | |
| 2008/0163148 A1 | 7/2008 | Scheffer et al. | |
| 2008/0163150 A1 | 7/2008 | White et al. | |
| 2008/0216027 A1 | 9/2008 | White et al. | |
| 2008/0307371 A1 * | 12/2008 | Fujimura et al. | 716/1 |
| 2009/0031261 A1 | 1/2009 | Smith et al. | |
| 2009/0031271 A1 * | 1/2009 | White et al. | 716/10 |
| 2009/0125868 A1 * | 5/2009 | Mukherjee et al. | 716/19 |
| 2009/0158227 A1 * | 6/2009 | Goren et al. | 716/5 |

OTHER PUBLICATIONS

Non-Final office Action dated Jun. 7, 2010 for U.S. Appl. No. 11/866,378.

Non-Final Office Action dated Jun. 6, 2010 for U.S. Appl. No. 11/866,383.

Final Office Action dated Jun. 9, 2010 for U.S. Appl. No. 11/866,386.

* cited by examiner

METHOD, SYSTEM, AND COMPUTER PROGRAM PRODUCT FOR PREPARING MULTIPLE LAYERS OF SEMICONDUCTOR SUBSTRATES FOR ELECTRONIC DESIGNS

CROSS-REFERENCE TO RELATED APPLICATION(S)

This application claims the benefit of U.S. Provisional Application No. 60/878,000, filed on Dec. 29, 2006, which is hereby incorporated by reference in its entirety.

BACKGROUND OF THE INVENTION

The ever-growing demand for more functionality and higher performance has caused increased complexity in integrated circuit (IC) designs requiring more yet smaller transistors to be closely packed. As a result, the integrated circuit chip size has continually increased to accommodate the ever-increasing number of transistors. This continual demand for smaller features improves the performance of integrated circuits but also adversely impacts the interconnect performances. Smaller wire sizes and spacing and longer lines to traverse larger chip areas have increased the resistance, capacitance and, as a result, the R-C delay. Moreover, this interconnect delay becomes more significant and can no longer be ignored as the feature sizes continue to shrink into the deep submicron regime.

Another adverse impact of this continual increase in chip size as a result of the demand for more functionality and higher performance is the number of chips per wafer decreases and thus increases the manufacturing cost as well as the cost of ownership of integrated circuits.

Thus there arises the development of three dimensional integration of chip design and manufacturing to create multiple levels of Silicon ICs to reduce the size of the integrated circuits and to improve interconnect delays and feature packing density by vertically stacking multiple dies and interconnecting these multiple dies with interconnects such as a high density, low latency interconnect interface.

Several approaches have been investigated, yet various limitations have been identified for each approach. For example, one method of three dimensional integration of integrated circuits is to bond two or more pieces of fully processed wafers with vias or interconnections electrically connecting the integrated circuits on both wafers. Furthermore, the backside of the these wafers may be etched away for bonding additional pairs of wafers. The advantage of this method is in that it preserves all the material properties known today, with the exception of the bonding layer between the wafers. However, the limitation on this method is the precision, or lack thereof, of overlaying two processed wafers each of which has been manufactured with extremely high precision atop each other. Typically, the best alignment techniques today may only bring the two wafers within +/−2 microns, which is far less precise than what is required for integrated circuits. Such an misalignment may cause great difficulties in the interconnects between the two pieces of wafers being bonded or glued together. Moreover, the variation in the flatness of the processed wafers may prohibit such bonding. This effect of varying curvature of the processed wafers is especially profound as the pair of wafers are usually bonded in opposite directions with the silicon substrate facing outwards. Additional problems introduced by the different quality of the back side of the wafer as well as the typical high particle count on the back side and the lack of effective mechanisms to control the particle problems further exacerbates the practicability of these approaches.

Traditional epitaxial growth of single crystal silicon through CVD processes has been known for its high temperature (~1000 degrees Celsius) and thus cannot be used in three-dimensional integration because it violates the thermal budget of an integrated circuit. Recent development of ultra-high vacuum CVD low temperature epitaxial processing technique has substantially reduced this thermal budget problem although manufacturability still has room for improvement.

Another method for forming a thin film transistor (TFT) is to deposit a thin film of polycrystalline silicon atop a substrate and then uses an intense energy source such as an electron beam or a laser to induce re-crystallization of the polysilicon film. This method may be improper for three-dimensional chip integration due to its high temperature process characteristics that may most likely exceed the thermal budget of a semiconductor device. It is not until the recent development of low temperature processing which has successfully demonstrated the fabrication of single crystal silicon TFTs.

Although the above technologies may be utilized for three-dimensional integrated circuit (IC) integration, they still have certain limitations and may even produce unsatisfactory results. For example, the resultant single silicon layer may not be sufficiently flat to accept subsequent semiconductor layers, and while it is theoretically possible to employ subsequent planarization processes to flatten the single silicon layer. The epitaxial growth process and the high energy re-crystallization process are known to be sensitive to, if not conformal to, the underlying interlayer dielectrics.

Other low temperature crystallization processes such as the metal induced lateral crystallization and low temperature deposition and crystallization of amorphous silicon may also be used in certain three-dimensional chip integration such as deep sub-micron polysilicon TFTs, stacked SRMA cells, and EEPROM cells have been successfully demonstrated.

However, all the above methods are sensitive to the topographical variations of the underlying film stack or even the substrate and thus severely limit the applicability and utility of three-dimensional integration. For example, the second semiconductor substrate atop the first film stack would limit the types of IC blocks because of the topographical variations/micro-roughness of the top surface of the second semiconductor substrate. Similarly, the variations in the flatness or the micro-roughness of the substrate may also cause problems in the fabrication and integration of modern integrated circuits. The surface variations or the micro-roughness will also continue to be a perturbation to lithographic tools.

SUMMARY OF THE INVENTION

Thus, there exists a need for an improved method for producing a multiple level semiconductor substrate for three-dimensional integrated circuits integration.

The basic concept in three-dimensional integration of multiple levels of Silicon ICs is to divide an integrated circuit into multiple blocks, to place each of these blocks on a silicon layer or die, and then stack some of the blocks or dies on top of the others with inter-level dielectric layers in between the levels, This basic requirement that the blocks or dies be built upon a single crystalline or recrystallized poly-silicon layer and would first require that the single crystalline or poly-silicon layers be first built atop some inter-level dielectrics.

The present invention is directed to an improved method, system, and computer program product for preparing multiple levels of semiconductor substrates for three-dimensional integrated circuits (IC) integration. The method or the system of some embodiments of the invention analyzes the one or more insulating dielectric layers (IDL) separating the first and the second film stacks on separate substrates and then determines one or more characteristics which are required to enable the surface of the IDL to receive an additional layer of semiconductor substrate for further fabrication of the chips. In some other embodiments of the present invention the method or the system of further employs the design model together with one or more concurrent models for the processes or techniques involved in the manufacturing of the integrated circuits to ensure that the IDL and the semiconductor substrate are sufficiently flat or smooth so the three-dimensional integrated circuits meet the reliability, manufacturability, yield, or performance requirements. In some other embodiments of the present invention, the method or the system further employs the design and the concurrent models to place the vias or interconnections connecting the multiple film stacks.

DESCRIPTION OF FIGURES

The drawings illustrate the design and utility of several embodiments of the present invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

The present invention is directed to an improved method, system, and computer program product for preparing multiple levels of semiconductor substrates for three-dimensional integrated circuits (IC) integration. The method or the system of some embodiments of the invention analyzes the one or more insulating dielectric layers (IDL) separating the first and the second film stacks on separate substrates and then determines one or more characteristics which are required to enable the surface of the IDL to receive an additional layer of semiconductor substrate for further fabrication of the chips. The method or the system of some other embodiments of the present invention further employs the design model together with one or more concurrent models for the processes or techniques involved in the manufacturing of the integrated circuits to ensure that the IDL and the semiconductor substrate are sufficiently flat or smooth so the three-dimensional integrated circuits meet the reliability, manufacturability, yield, or performance requirements. The method or the system in some other embodiments of the present invention further employs the design and the concurrent models to place the vias or interconnections connecting the multiple film stacks.

More particularly, some embodiments employ the concurrent or design models of the first film stack, especially of the last layer, and the process or design models of the IDL to pre-determine the properties, geometries, characteristics, and parameters of the IDL and then determine whether the IDL meets the design objectives or design constraints. Some other embodiments further employ the results of the above determination act to ensure the IDL is sufficient to receive the next semiconductor substrate layer by either modifying the designs of the IDL or the underlying designs or modifying one or more of the fabrication processes.

Figure 1A:
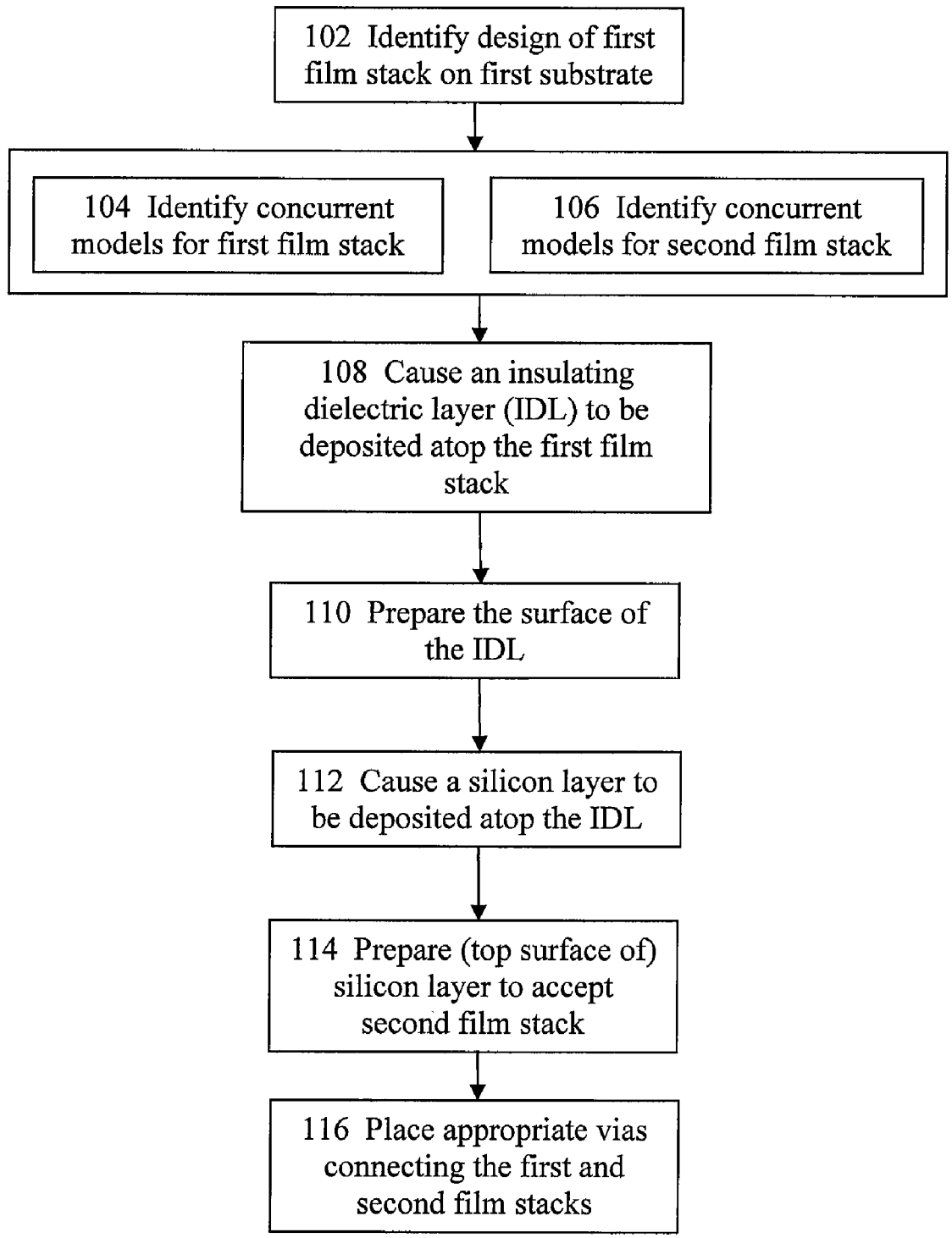
FIGS. 1A and 1B illustrate a general flow of the method for preparing multiple levels of semiconductor substrate layers for three-dimensional IC integration.

Referring to FIG. 1 which illustrates a general flow of a method for preparing multiple levels of semiconductor substrate layers for three-dimensional IC integration. In some embodiments of the present invention, the method or the system identifies the electronic circuit design at 102. The method or the system of some embodiments of the present invention further identifies one or more concurrent models for the processes or techniques for the manufacturing of the first film stack at 104. At, 106, the method or the system of some embodiments of the present invention further identifies the electronic circuit design or one or more concurrent models for the processes or techniques involved in the fabrication of the second film stack.

At 108, the method or the system of some embodiments of the present invention may optionally determine how an insulating dielectric layer (IDL) is to be created atop the first film stack. For example, in one embodiments, the method or the system may determine one or more parameters for the deposition or creation of the IDL atop the first film stack. In another embodiment, the method or the system may further determine such one or more parameters for the deposition or creation of the IDL atop the first film stack based upon the analysis or information of the underlying structure. It shall be noted that in some embodiments, the underlying structure comprises the first film stack or the substrate such as a wafer; in some other embodiments, the underlying structure may comprise the top layer of the first film stack or an IDL. It shall be noted that such an IDL may be, in some embodiments, necessary to electrically insulate the first and the second film stacks. In some embodiments of the invention, the IDL may comprise an inter-layer dielectric (ILD) layer deposited or created atop the first film stack.

At 110, the method or the system of some embodiments of the present invention may optionally analyze the surface of the IDL in conjunction with one or more additional concurrent models to prepare and enable the surface of the IDL to properly receive the next layer of semiconductor substrate. It shall also be noted that the next semiconductor substrate layer may comprise an intrinsic semiconductor. In some embodiments, the next semiconductor substrate layer may comprise simply a second semiconductor substrate layer or a second semiconductor substrate layer plus one or more buffer layers such as a silicon-germanium layer atop the second semiconductor substrate layer. At 112, the method or the system analyzes the underlying structure(s) of the stack and determine an optimal set of one or more parameters to determine one or more processes which cause a silicon substrate layer to be deposited or created atop the IDL. Such a silicon substrate layer may comprise intrinsic semiconductor. Such a silicon substrate may comprise a polycrystalline, a single crystalline silicon layer, other single or polycrystalline indirect bandgap semiconductor layer, or some direct bandgap semiconductor layer such as a gallium arsenide layer and may be deposited or grown on top of the IDL by, for example, a ultra-high vacuum CVD low temperature epitaxial growth process, a low temperature electron beam or laser induced re-crystallization process of the polysilicon, a metal induced lateral crystallization, or a low temperature deposition and crystallization of amorphous silicon.

At 114, the method or the system of some embodiments of the present invention may optionally incorporate one or more additional concurrent models for processes or techniques involved in further preparing the top surface of the silicon substrate layer in order to properly receive the second film stack. At 116, the method further determines the location and sizes of vias or interconnects which electrically connect the first and the second film stacks.

Some embodiments analyze the integrity of the vias or interconnections to determine whether the vias or interconnections are properly sized and positioned. Where the analysis shows that certain vias or interconnections may be subject to excessive electrical, mechanical, or strain-induced stresses, some embodiments may employ redundant vias to relieve the excessive load on such vias or may resize such vias to reduce the stresses. Where the analysis show that certain vias or interconnections may be under-loaded, some other embodiments may determine to relocate or resize the vias or interconnections.

Moreover, the method or the system in some embodiments of the invention employs the design or the one or more concurrent models to analyze each individual substrate and its film stack atop the substrate. The method or the system of some embodiments of the present invention may analyze one or more dielectric layers such as the IDL separating the first substrate from the film stack atop the first substrate to determine whether the flatness or the micro-roughness of the top most dielectric layer may meet one or more requirements of the integrated circuit to be built atop of the one or more dielectric films for the first substrate. The method or the system of some other embodiments of the present invention may also analyze any films separating two levels of film stacks on the same substrate to ensure that the integrated circuits as manufactured will meet various requirements.

For example, the method or the system of some embodiments of the present invention may analyze the substrate and one or more films atop the substrate such as a germanium layer, a silicon-germanium buffer layer, or a silicon dioxide layer and determine the proper characteristics of such a film stack based upon one or more attributes of the respective underlying layer to ensure the existing film structures are capable of receiving additional films while second film stack or the entire design meets all the performance, manufacturability, or reliability requirements.

For example, the method or the system of one embodiment of the present invention may incorporate one or more concurrent models for the fabrication of silicon-germanium layer atop a single crystalline silicon substrate to analyze and determine one or more parameters for the silicon-germanium layer based upon, for example, the micro-roughness or the flatness of the single crystalline silicon substrate such that the silicon-germanium buffer layer is suitable to receive additional film stacks while ensuring the second film stack or the entire design meets the design specification or design goals. A typical fabrication process for such purposes may comprise a silicon epitaxy growth process. The fabrication process upon which the one or more concurrent models are built may also comprise an UV-$Cl_2$ cleaning process, an UV-$O_3$ cleaning process, or the equivalent. The UV-$Cl_2$ cleaning process has been demonstrated to produce surfaces with root mean square micro-roughness of 0.1±0.01 nm. Furthermore, an UV-$Cl_2$ cleaning process involves ultraviolet irradiation of the substrate surface in a $Cl_2$ ambient within a reduced pressure processing chamber (e.g., a vacuum chamber) at a controlled substrate temperature. Similarly, an UV-$O_3$ cleaning process involves ultraviolet irradiation of the substrate surface in a $O_3$ ambient within a reduced pressure processing chamber (e.g., a vacuum chamber) at a controlled substrate temperature. These two dry cleaning processes remove contaminants from substrate surfaces by removing these contaminants by momentum transfer, by converting the contaminants into volatile species through chemical reaction, or by an etching process. These cleaning processes have been proven to be effective to remove organic or metallic contaminants from the surface of the substrate.

As another example where the design may requires a silicon dioxide layer on top of the silicon-germanium layer, the method or the system of another embodiment of the present invention may incorporate one or more concurrent models for the fabrication of the silicon dioxide layer atop the silicon-germanium layer to analyze and determine one or more parameters for the silicon dioxide layer based upon, for example, the micro-roughness or the flatness of the silicon-germanium such that the silicon dioxide layer is suitable to receive additional film stacks while ensuring the entire design meets the specification. As another example where more than one metal layer is involved in an electronic circuit design. the method or the system of some embodiments of the present invention may analyze the insulating dielectric layers (IDL) between two metal layers with the one or more concurrent models to ensure that the inter-layer dielectrics are adequate to receive the subsequent layers atop while ensuring the entire design still meets the design objectives or goals.

In another embodiment, the method or the system may further incorporate one or more concurrent models for thermal processing to more precisely analyze the impact of thermal processing on micro-roughness of the underlying film or substrate, the ability of the underlying structure to receive additional film stack, or the design objectives based upon the flatness or micro-roughness of the underlying structure. Such thermal processing may comprise, for example but shall not be limited to, rapid thermal processing, thermal oxidation, reflow process, dopant activation, or even other high-temperature processes such as epitaxy growth processes, chemical vapor deposition process, or physical vapor deposition processes.

The method or the system of some embodiments of the invention are particularly useful in electronic circuit designs with ever continuing efforts to shrink the feature sizes and to increase performances as extremely thin gate oxides are usually involved in this type of device especially in the deep submicron regime.

In some embodiments of the present invention, a concurrent model may be constructed based purely upon direct simulation of the underlying principles of physics or mathematical methods for the process or technique which the concurrent model precisely describes.

In other embodiments, a concurrent model may first be built upon some physics principles or mathematical methods to approximate the process or technique the concurrent is to describe. Such an approximate concurrent model may be further fine tuned with data or information obtained from sources such as one or more patterned test wafers or from other sources of limited fidelity such as a simple analytic model, empirical formulae or models, formulae or models with interpolation or extrapolation of information or data, or other approximations. That is, a concurrent model may be constructed by some, for example, simplified physics principles or mathematical methods and may then be further fine tuned by data or information obtained from one or more patterned test wafers or from other sources of limited fidelity such as a simple analytic model, empirical formulae or models, formulae or models with interpolation or extrapolation of information or data, or other approximations.

In some other embodiments, a concurrent model may be constructed purely upon data or information obtained from one or more patterned test wafers or from other sources of limited fidelity such as a simple analytic model, empirical formulae or models, formulae or models with interpolation or extrapolation of information or data, or other approximations. For part or all of a given layer of an electronic circuit design or even the entire electronic circuit design, there may exist concurrent models built by some or all the aforementioned methods. There may exist concurrent models constructed by more than one of the aforementioned method even for the same process or technique which the concurrent models are constructed to describe. For example, where greater accuracy is desired or where the performance is critical in a sub-circuit, the concurrent model may be built upon physics principles or mathematical methods with or without the aid of extracted data or information from patterned test wafers. As another example, where the performance is not critical in certain part of the electronic circuit or where reducing cost is of greater concern for certain part of a layer of the electronic circuit design or certain part of the electronic circuit itself, a concurrent model may be built purely upon information or data obtained from patterned test wafers, other less accurate but easier or less expensive models with limited fidelity such as a simple analytic model, empirical formulae or models, formulae or models with interpolation or extrapolation of information or data, or other approximations.

The concurrent models may be constructed to incorporate one or more processes or techniques involved in the manufacturing of the electronic circuit. The one or more processes or techniques utilized in these methods or systems comprise models for fabrication processes or techniques, metrology processes or techniques, or image processing techniques.

Moreover, the fabrication process or technique may comprise, for example but shall not be limited to, a deposition process, a removal process, a patterning process, or a property modification process or technique.

More particularly, the deposition processes or techniques upon which the one or more concurrent models are built may comprise, for example but shall not be limited to, physical vapor deposition (PVD), chemical vapor deposition (CVD), atomic layer deposition (ALD), electrochemical deposition or electro-plating (ECD), electroless plating or deposition, auto-catalytic plating or deposition, and molecular beam epitaxy (MBE). The removal processes may comprise, for example but shall not be limited to, isotropic or anisotropic wet or dry etching, chemical mechanical polishing (CMP), or reflow processes.

The removal process or technique may comprise, for example but shall not be limited to, isotropic or anisotropic wet or dry etching, chemical mechanical polishing (CMP), or reflow processes.

The patterning processes may comprise, for example but shall not be limited to, lithography processes or techniques such as lithography processes or techniques comprise microlithography, nanolithography, photolithography, electron beam lithography, maskless lithography, nanoimprint lithography, interference lithography, x-ray lithography, extreme ultraviolet lithography, or scanning probe lithography, or the plasma ashing processes.

The property modification processes or techniques may comprise, for example but shall not be limited to, ion implantation, annealing, oxidation, UVP (ultraviolet light processing).

The metrology process or technique may comprise, for example but shall not be limited to, transmission electron microscopy (TEM), scanning electron microscopy (SEM), transmission electron aberration-corrected microscopy, energy filtered TEM, optical measurement techniques, Raman scattering, infrared spectroscopy, x-ray diffraction, optical absorption, photoluminescence, or electrical measurement techniques.

The imaging processing techniques or processes may comprise, for example but shall not be limited to, various resolution enhancement techniques such as ruled-based or model-based Optical Proximity Correction (OPC), Subresolution Assist Features (SRAF), Phase Shifting-Mask (PSM), and Off-Axis Illumination (OAI).

Some embodiments may combine the output of a concurrent model into a discrete value for a given feature or multiple values for a given feature in the form of a distribution or a statistical representation of the data such as mean, variance and range.

Some other embodiments may be applied where only a portion of the final complete layout, for example one or more blocks or cells, is available. A context simulation method may be used to introduce likely geometric environments into the incomplete regions, for example structures with similar densities or line widths, or an environment with a geometric distribution based on prior designs. For processes with large pattern interaction ranges such as CMP, simulation of layout portions not available may be useful. More details about context simulation is described in U.S. patent application Ser. No. 11/768,851, entitled "METHOD AND SYSTEM FOR IMPLEMENTING CONTEXT SIMULATION" filed on Jun. 26, 2007, which is incorporated herein by reference in its entirety.

Figure 1B:
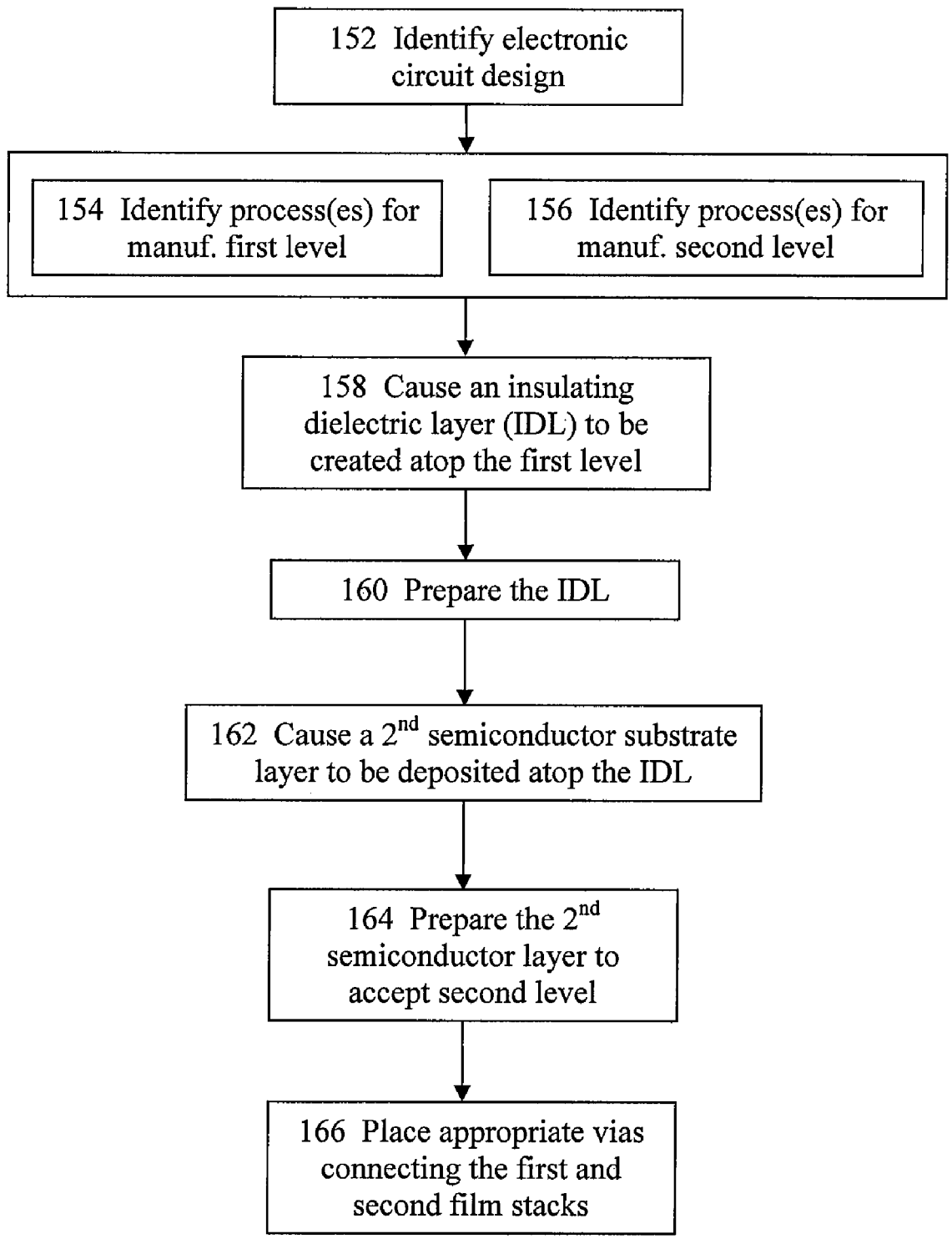

Referring to FIG. 1B which illustrates a general flow of a method or a system for preparing multiple levels of semiconductor substrate layers for three-dimensional integrated circuit (IC) integration. In some other embodiments, the method or the system identifies an electronic circuit design to be manufactured at 152 or the processes for the manufacturing of the first film stack or first level of the electronic circuit at 154. It shall be noted that a level of the electronic circuit may comprise an interconnect level, a metal layer, or a mask level of the electronic circuit. At 156, the method or the system further identifies the electronic circuit design or processes for the manufacturing of the second film stack or the second level of the electronic circuit. At 158, the method or the system causes an insulating dielectric layer (IDL) to be deposited or created atop the first film stack. Such an IDL may electrically insulate the first and the second film stacks and may comprise, for example, an inter-layer dielectric (ILD). At 160, the method or the system may optionally process or prepare the IDL or the surface of the IDL so as to enable the IDL to receive the next semiconductor substrate layer. For example, the method or the system may invoke one or more processes such as a planarization process or a dry cleaning process such as an UV-$Cl_2$ or an UV-$O_3$ process.

At 162, the method or the system causes the next semiconductor substrate layer to be create atop the IDL. Such a semiconductor substrate layer may be a polycrystalline or a single crystalline silicon layer or a germanium layer, and may be deposited, created, or grown onto the IDL by, for example, an ultra-high vacuum chemical vapor deposition (CVD) process or plasma enhanced chemical vapor deposition (PECVD) process, a low temperature epitaxial growth process, a low temperature electron beam or laser induced re-crystallization process of the polysilicon, a metal induced lateral crystallization process, or a low temperature deposition and crystallization of amorphous silicon process. At 164, the method or the system may optionally prepare the second semiconductor substrate layer or the top surface of the second semiconductor substrate layer in order to properly receive the second level of the electronic circuit. At 166, the method or the system further identify the locations or sizes of vias or interconnects which connect the first and the second level and manufactures the vias or the interconnects in accordance with the electronic circuit design.

Figure 2:
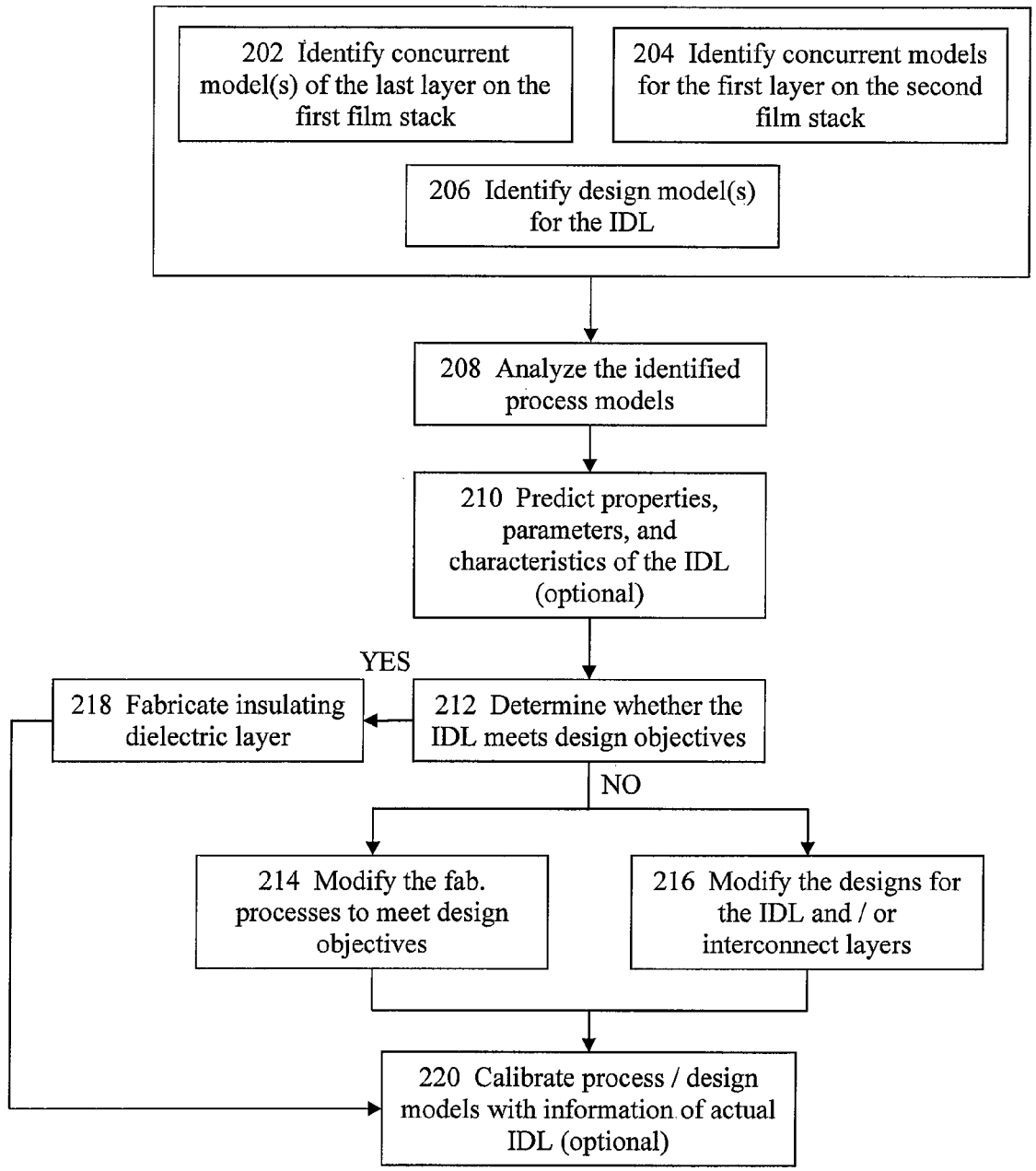
FIG. 2 illustrates an example of the method for causing an insulating dielectric layer to deposit atop the first film stack.

Referring to FIG. 2 which further illustrates more details of act 108 in FIG. 1. The method or the system of some embodiments of the present invention, first identifies one or more concurrent models of the last layer on the first film stack at 202 and the design model(s) of the IDL at 206. The method or the system of some other embodiments of the present invention may also optionally identify one or more concurrent models for the first layer on the second film stack at 204. The method or the system of some embodiments of the present invention analyzes the above identified concurrent or design models at 208. At 210, the method or the system may optionally proceed to predict various properties, parameters, and characteristics of the IDL. Such properties, parameters, and characteristics may include physical, electrical, chemical, thermal, and design related attributes of the IDL. Typical examples of these properties, parameters, or characteristics may comprise but shall not be limited to the density (local or bulk density), physical dimensions and geometries, dielectric constant, resistivity, capacitance, potential difference across the dielectrics, distribution of species within a film, composition of a film, and many others.

At 212, the method to determine, based in part upon the concurrent models and designs, whether the IDL as designed meets the design objectives such as the reliability, manufacturability, yield, leakage current, or performance criteria. If the IDL meets the design objectives or constraints, the method or the system of some embodiments of the present invention proceeds to 218 where the IDL design is complete and can be fabricated. Where the IDL fails to meet certain design objectives or constraints, the method or the system of some embodiments of the invention may modify the IDL fabrication processes or modify the IDL at 214 or underlying designs such as the interconnect layers to meet the design objectives at 216.

A constraint is a design target that must be met in order for the design to function as designed. For example, an IC may be required to operate at or above a clock frequency or within a band of frequencies. Such a clock frequency requirement may be considered a constraint. On the other hand, an objective is a design goal which, even if not met, would not cause the IC product to fail or to improperly function. Rather, a design objective is one that more or higher is better. For example, a yield requirement may be considered a design objective as failure to meet the yield requirement would not cause the IC to fail or to function improperly, and the higher the yield the better the profitability will be. Finally, the method or the system of some embodiments of the present invention may optionally incorporate the information of the IDL to be manufactured in accordance with the design to calibrate the IDL process and design models for this specific design for future references at 220. Some other embodiments employ an additional act to determine whether the IDL may be deposited atop the existing vias or interconnections.

Figure 3:
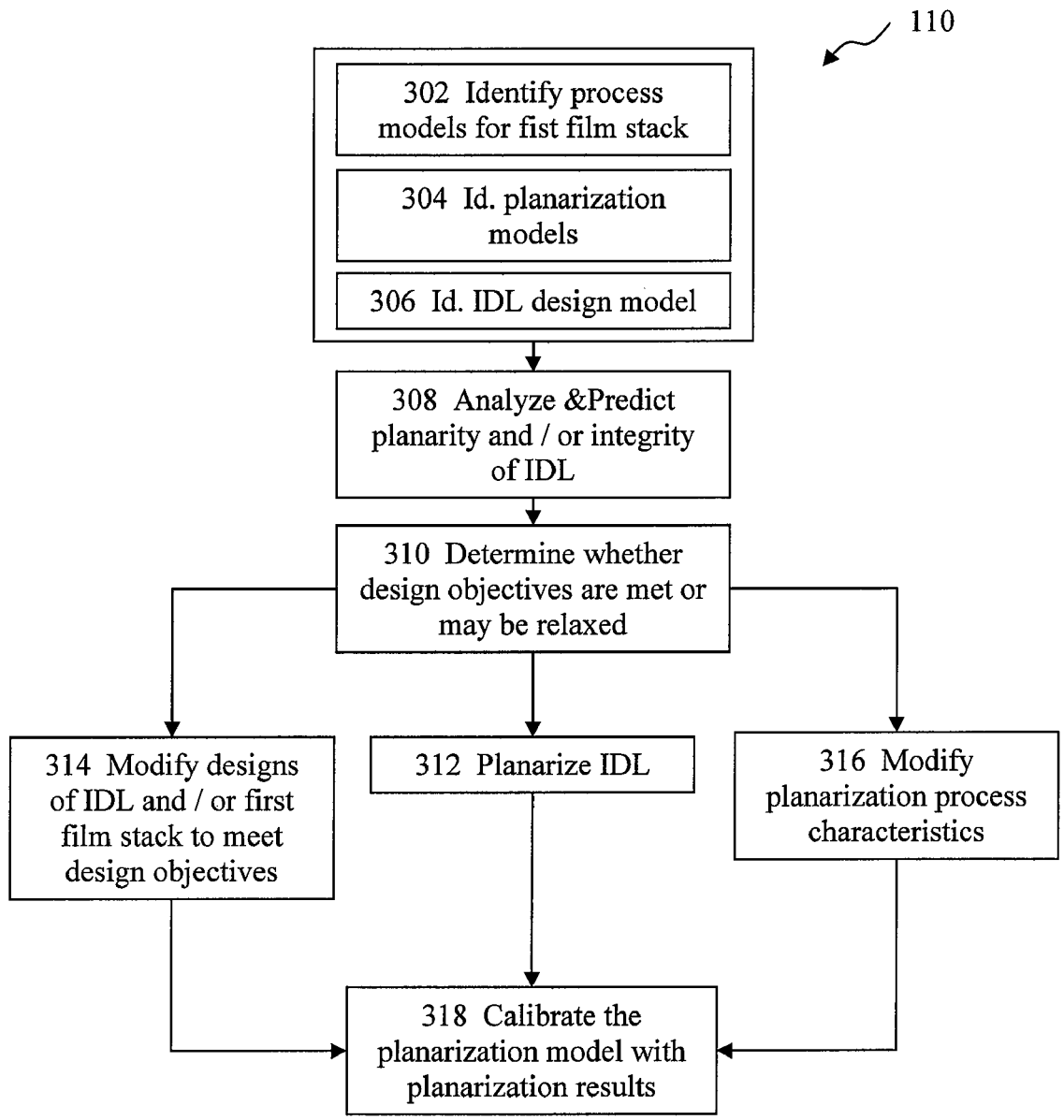
FIG. 3 illustrates an example of the method for preparing the ILD surface in order to receive subsequent semiconductor substrate layer.

FIG. 3 further illustrates further details of the optional act 110. At acts 302, 304, and 306, the method or the system of some embodiments of the present invention respectively identifies the one or more concurrent model or the design model for the first film stack, the fabrication models such as a planarization model or a cleaning process model (e.g., a UV-$Cl_2$ cleaning process, an UV-$O_3$ cleaning process, or the equivalent), and the one or more IDL fabrication concurrent models or the design model. At 308, the method or the system of some embodiments of the present invention then analyzes the above identified models and may further optionally predict the planarity, micro-roughness, or integrity of the IDL. At 310, the method or the system of some embodiments of the present invention determines whether all the design objectives or constraints are satisfied or whether some of the design objectives may be relaxed. Some typical examples of such design objectives or constraints comprise, but shall not be limited to, reliability, manufacturability, yield, and performance of the IDL or subsequent film stack or integrated circuits to be integrated atop the current IDL.

Where all of the design objectives or constraints are satisfied or where some of the design objectives or constraints, although violated when not modified, may be relaxed, the design check act for the IDL is complete, and the planarization act may be performed at 318. Where some of the design objectives or constraints are not met and cannot be relaxed, the method or the system of some embodiments of the present invention may proceed to 314 to modify the design of the IDL or the first film stack or to 316 to modify their respective fabrication process characteristics to meet the design objectives or constraints. For example, the method or the system of some embodiments of the present invention may modify the underlying designs of the first film stack or the IDL to change the topographical pattern of the IDL as a result of its pattern dependency upon the underlying structures.

Figure 4:
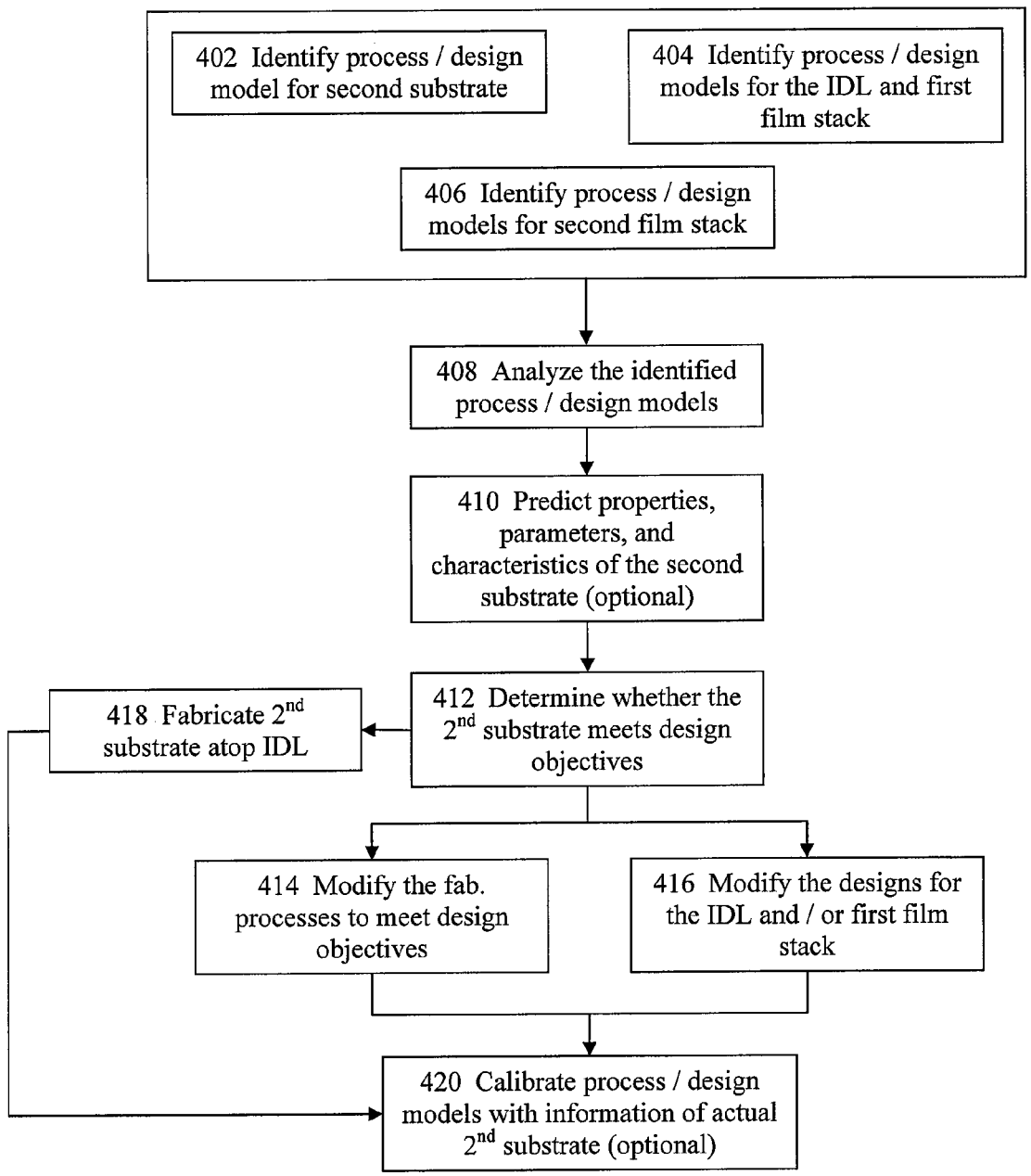
FIG. 4 illustrates an example of a method for determining and verification of the second semiconductor substrate layer atop the IDL.

Referring to FIG. 4 which illustrates further details of the determination and verification of a second semiconductor substrate film atop the IDL. At 402, the method or the system of some embodiments of the present invention identifies the one or more concurrent model for the processes or techniques involved in the manufacturing of the second semiconductor substrate film or design models of the second semiconductor substrate film. At 404, the method employs the process or design models for the IDL and the first film stack. It is noted that in some embodiments, the second semiconductor substrate film may comprise a single crystalline silicon layer. In some other embodiments, the second semiconductor substrate film may comprise a poly-silicon layer such as a recrystallized poly-silicon layer. In some other embodiments of the present invention, the second semiconductor substrate film may comprise either a single crystalline silicon or a poly-silicon layer with one or more additional layers atop the single crystalline silicon or poly-silicon layer. For example, the second semiconductor substrate film may further comprise a silicon-germanium layer atop or even a silicon-germanium buffer layer with an additional silicon dioxide layer atop the silicon-germanium layer. In some embodiments, the second semiconductor substrate film may comprise the IDL.

At 406, the method or the system of some embodiments of the present invention identifies the one or more concurrent models for the processes or techniques involved in the manufacturing of the second film stack or one or more design model for the second film stack to be built on the second semiconductor substrate film. The method or the system of some embodiments of the present invention then analyzes the above identified models at 408. At 410, the method or the system of some embodiments of the present invention may optionally proceed to predict the properties, parameters, and characteristics of the second semiconductor substrate film. Such properties, parameters, and characteristics may include physical, thermal, electrical, and design related attributes of the second semiconductor substrate film.

The method or the system of some embodiments of the present invention then proceeds to 412 to determine, based in part upon the one or more concurrent models and the one or more design models, whether the second semiconductor substrate film as designed meets the design objectives or design constraints such as the reliability, manufacturability, yield, or the performance criteria. If the second semiconductor substrate film meets the design objectives or the design constraints, the method or the system of some embodiments of the present invention proceeds to 418 where the design of the second semiconductor substrate film is complete. Where the second semiconductor substrate film fails to meet certain design objectives or design constraints, the method or the system of some embodiments of the present invention may modify the second semiconductor substrate film manufacturing processes or techniques by generating one or more parameters for the manufacturing processes or techniques or modify the design of the second semiconductor substrate film at 414 or its the one or more designs for its underlying structures such as the IDL and various underlying interconnect layers to meet the design objectives or the design constraints at 416. Finally, the method or the system of some embodiments of the present invention may optionally incorporate the information or data of the second semiconductor substrate film to be manufactured in accordance with its design to calibrate the manufacturing processes or techniques for the second semiconductor substrate film and its one or more design models for this specific design for future references at 420.

Figure 5:
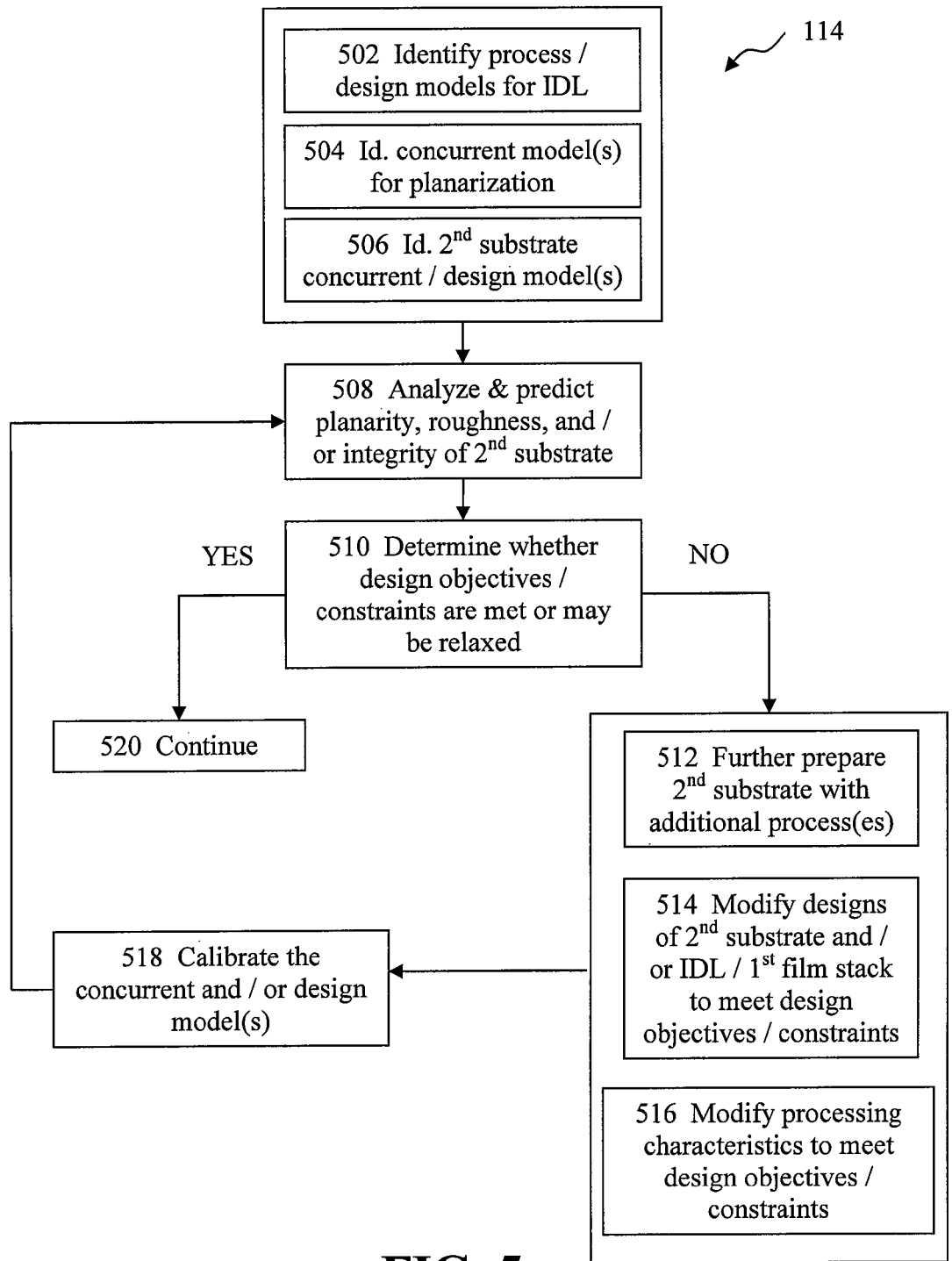
FIG. 5 illustrates an example of a method for preparing the surface of the second semiconductor substrate layer in order to receive the second film stack.

Referring to FIG. 5 which illustrates further details of the act 114. At acts 502, 504, and 506, the method or the system in some embodiments of the present invention respectively identifies one or more concurrent models for the processes or techniques involved in the manufacturing or one or more design models for the IDL, the fabrication process models such as a planarization model, and one or more concurrent models for the processes or techniques involved in the manufacturing of the second semiconductor substrate film or one or more design models for the second semiconductor substrate film. At 508, the method or the system of some embodiments of the present invention analyzes the above identified models and may optionally predict the planarity, flatness, microroughness, or integrity of the second semiconductor substrate film. At 510, the method or the system of some embodiments of the present invention determines whether all the design objectives or design constraints are satisfied or whether some of the design objectives or design constraints may be relaxed with respect to the second semiconductor substrate film. Some typical examples of such design objectives or constraints comprise, but shall not be limited to, reliability, manufacturability, yield, or performance of the second semiconductor substrate film. Such design objectives or constraints may also comprise the reliability, manufacturability, yield, or performance of the subsequent film stack atop the second semiconductor substrate film.

Where all of the design objectives or constraints are met or where some of the design objectives or constraints, although unsatisfied when the designs or the processes or techniques are not modified, may be relaxed, the method or the system of some embodiments of the present invention proceeds to 520 to continue the design activities. For example, the designer may generate the Graphical Data System II (GDS II) file for tapeout or may perform further verification before final tapeout.

In the alternative, where not all of the design objectives or constraints are satisfied or where some of the design objectives or constraints, although unsatisfied, may be relaxed, the method or the system of some embodiments of the present invention may, at 512, further prepare the second semiconductor substrate layer by processes such as a planarization process, a cleaning process (e.g., an UV-$Cl_2$ cleaning process, an UV-$O_3$ cleaning process, or the equivalent), or a removal process such as a chemical mechanical polishing process or a wet or dry, isotropic or anisotropic etching process. In some other embodiments, the method or the system may, at 516, determine to modify one or more characteristics of the processes or techniques involved in the manufacturing of the second semiconductor substrate layer or its underlying structures such as the film stack underneath the second semiconductor substrate layer or the IDL atop the film stack. In some other embodiments of the present invention, the method or the system may, at 514, determine to modify one or more parameters of the design of the second semiconductor substrate layer, the film stack underneath the second semiconductor substrate, or the IDL atop the aforementioned film stack.

In some other embodiments, the method or the system may determine to implement more than one of the options as listed in 512, 514, and 516. For example, the method or the system in some embodiments of the present invention may determine to employ the method or system of 512 to further prepare the second semiconductor substrate layer and the method or the system of 514 or 516 to modify the design(s) or the characteristics of the processes or techniques for the manufacturing of the second semiconductor substrate layer or its underlying structures. Whether a particular embodiment determines to implement which options of 512, 514, or 516 may be based upon one or more criteria. The one or more criteria may comprise, for example but shall not be limited to a design goal, a design objective, or a design constraint. For instance, the method or the system of one embodiment of the present invention may determine to implement some or all of the options as listed in 512, 514, and 516 to meet a cost objective. In another embodiment, the method or the system may determine to implement 512 and either or both of 514 and 516 to meet a performance objective or constraint where the electronic circuit features are subject to tight specifications, and the permissible variations in these features are typically much narrower.

Where not all the design objectives and/or constraints are satisfied and cannot be relaxed, the method or the system of some embodiments of the present invention may, at 518 and depending upon the action(s) chosen among 512, 514, and 516, optionally calibrate the one or more concurrent models for the processes or techniques involved in the manufacturing of the electronic circuit based upon the action chosen after 510. For example, the method or the system of some embodiments of the present invention may further incorporate, fine tune, modify, or calibrate the one or more design or concurrent models for the processes or techniques for preparing the second semiconductor substrate layer if the method or the system determines to further prepare the second semiconductor substrate layer. The method or the system of some other embodiments of the present invention may also incorporate, fine tune, modify, or calibrate the one or more design or concurrent models to reflect the changes made to the designs or processes for the second semiconductor substrate or its underlying structures.

In the alternative, the method or the system of some embodiments of the present invention may also independently calibrate, modify, or fine tune the concurrent or design models with additional information or data from sources such as one or more patterned test wafers or from other sources of limited fidelity such as a simple analytic model, empirical formulae or models, formulae or models with interpolation or extrapolation of information or data, or other approximations. For example, the method or the system of some embodiments of the present invention may obtain the information or data from one or more patterned test wafers or from other sources with limited fidelity containing identical or similar electronic design features as those to be made in the actual electronic circuit design and use such obtained information or data to fine tune or calibrate the design or the concurrent models to more accurately reflect the actual characteristics of the electronic circuit design to be manufactured. One common goal of all the alternative approaches as described in FIG. 5 is to ensure that all of the design objectives or the design constraints are either satisfied or may be relaxed so the electronic circuit performs its intended functions and meets the design goals.

Figure 6:
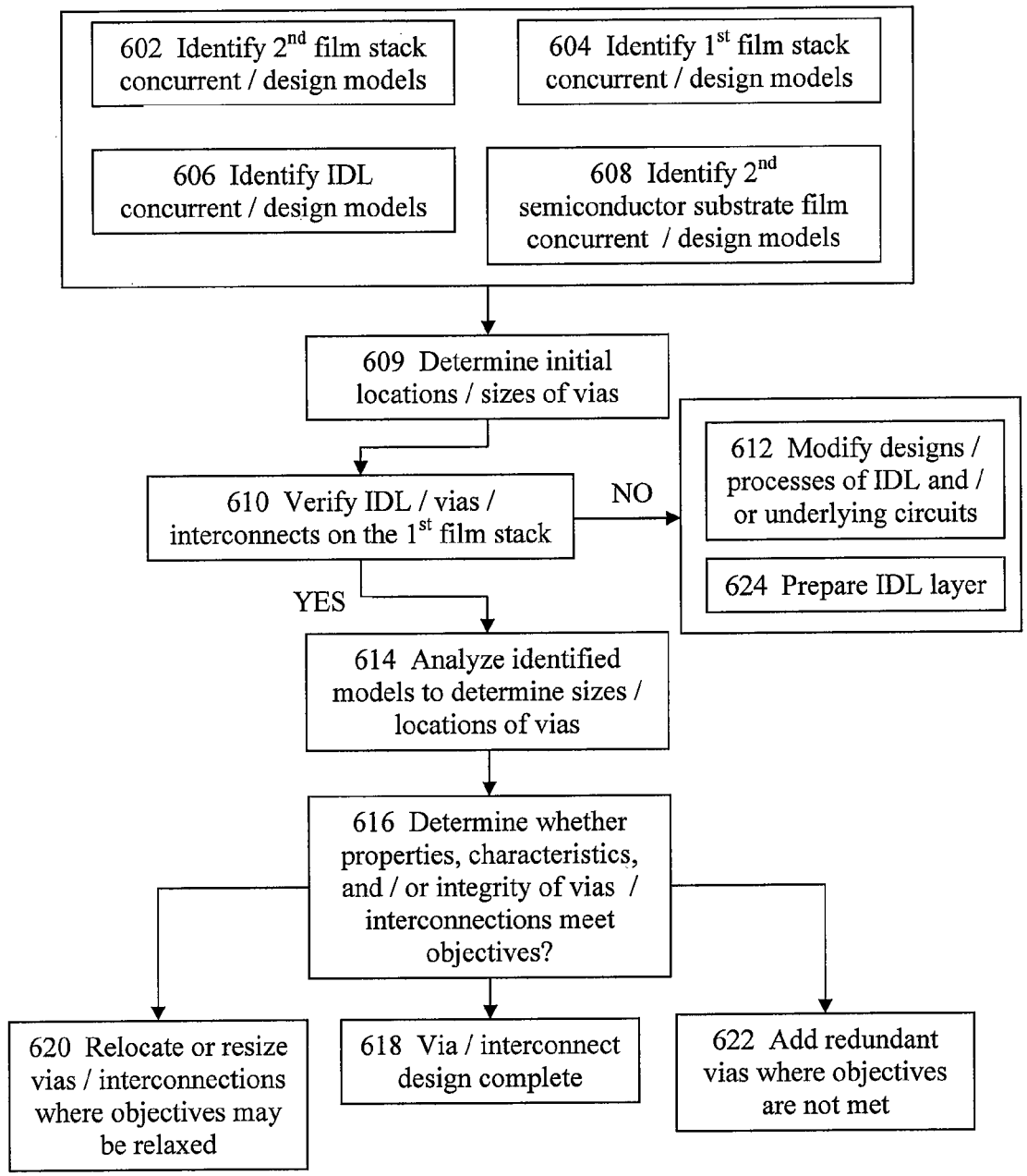
FIG. 6 illustrates an example of a method for determining and verifying the locations and sizes of vias or interconnections connecting the first and the second film stacks.

Referring to FIG. 6 which illustrates a simplified methodology for determining the locations and sizes of the vias or interconnections connecting the first and the second film stacks. The method or the system of some embodiments of the present invention, at 602, 604, 606, and 608, respectively identifies the one or more concurrent or design models for the second film stack, the first film stack, the IDL, and the second semiconductor substrate layer. At 609, the method or the system of some embodiments of the present invention first preliminarily determines the locations or sizes of vias or interconnections based upon the above identified models. In some embodiments, the method or the system may incorporate the one or more concurrent models and employ a methodology similar to the one in a physical design tool to determine the preliminary locations or sizes of the vias or interconnects based upon a criterion such as reduction or minimization of wire length or thermal requirements. At 610, the method or the system of some embodiments of the present invention then verifies the IDL in conjunction with the vias or interconnects with the information from the above identified models together with other information such as, but not limited to, the diffusion or the electrical models for the IDL materials and the material of the vias or interconnections. In some embodiments of the present invention, the In some other embodiments of the present invention, the method or the system may determine or verify whether the IDL meets the one or more requirements of flatness, micro-roughness, or integrity so as to be capable of receiving additional semiconductor substrate or other layers for three-dimensional integration.

Depending upon the technology chosen for the interconnections, the method or the system of some embodiments of the present invention may further evaluate the additional semiconductor substrate layer to determine whether the additional semiconductor substrate layer meets the one or more requirements so as to be capable of receiving additional film stacks on top. In some other embodiments, the method or the system may evaluate the additional semiconductor substrate layer in conjunction with the film stack atop the additional semiconductor substrate layer to determine whether the additional semiconductor substrate layer meets the one or more requirements so as to be capable of receiving additional film stacks on top. For example, the method or the system in these embodiments may evaluate the flatness, micro-roughness, or integrity of this additional semiconductor substrate layer with the vias or interconnections between this additional semiconductor substrate layer and the one underneath to determine whether this additional substrate layer is fit for receiving additional film stack on top.

For instance, assuming the design for a bare second semiconductor substrate layer is to yield an additional substrate which, when manufactured as designed, meets all the requirements to receive additional layers. In certain processes, analyzing or evaluating the bare second substrate alone to determine whether it meets the requirements for additional film stacks may be sufficient. This additional substrate may, however, cause the insulating layer atop the additional substrate to fail to meet some requirements when the vias or interconnects which connects the circuitry on this additional substrate to the one below are taken into consideration for some other processes For example, this additional substrate may not be sufficiently flat due to the presence of the features on the additional substrate or subsequent layers of materials to accommodate the vias or interconnections due to the manufacturing processes. In this case, it may be desirable to analyze this additional semiconductor substrate layer in together with the interconnections or vias to determine whether the additional semiconductor substrate layer or the additional layer on top (e.g., a buffer layer or an insulating oxide layer) are capable of receiving the additional film stack.

Where the verification of the IDL returns unsatisfactory results, the method then proceeds to 612 to modify the process or designs of the ILD or the underlying circuits. Where the verification of the IDL returns satisfactory results at 610 or after 612, the method proceeds to 614 to analyze the above identified models to determine the more precise locations and sizes of vias or interconnections connecting the first and the second film stacks. The method then proceeds to 616 to determine whether the properties, characteristics, parameters, or integrity of vias or interconnections meet the design objectives or constraints or whether some of the design objectives or constraints may be relaxed. Where all of the design objectives or constraints are satisfied or where some of the objectives are violated but may be relaxed, the method or the system of some embodiments of the present invention then proceeds to 618 and completes the via or interconnection design process. Or, where all of the design objectives or constraints are not satisfied yet the analysis determines that some of the objectives or constraints may be relaxed, the method then proceeds to 620 to relocate, resize, or eliminate some of the vias or interconnections which may have contributed to the possible relaxation of the design objectives or constraints. Where some of the design objectives or constraints are violated yet cannot be relaxed, the method proceeds to 622 to add redundant vias, to resize vias, or to relocate the vias causing the violation.

Some other embodiments further employ an additional act to display the vias or interconnections which may be causing the design objective violations. Some other embodiments further obtain the information about the fabricated features of the design and use such information to further calibrate the process models as well as the modifications to the designs or the fabrication processes so as to improve the accuracy and effectiveness of the above methods.

Some other embodiments further utilize systems utilizing parallel computing architecture to achieve the purpose. Some other embodiments also store the results in a data structure or a database for subsequent retrieval as well as use.

Some embodiments translate the information about the process models or the design elements into a separate set of requirements without unnecessarily disclosing such process models or the design elements to third parties. These methods are particularly useful in protecting the ownership of intellectual property and rights therein. For example, the semiconductor Fabs may not wish to disclose such information to other parties; the processing equipment manufacturers may not wish to disclose the true capabilities of their processing equipment to other parties; and IP core owners may wish to grant only the right to use without disclosing further details of such IP cores to the licensees or users.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

System Architecture Overview

Figure 7:
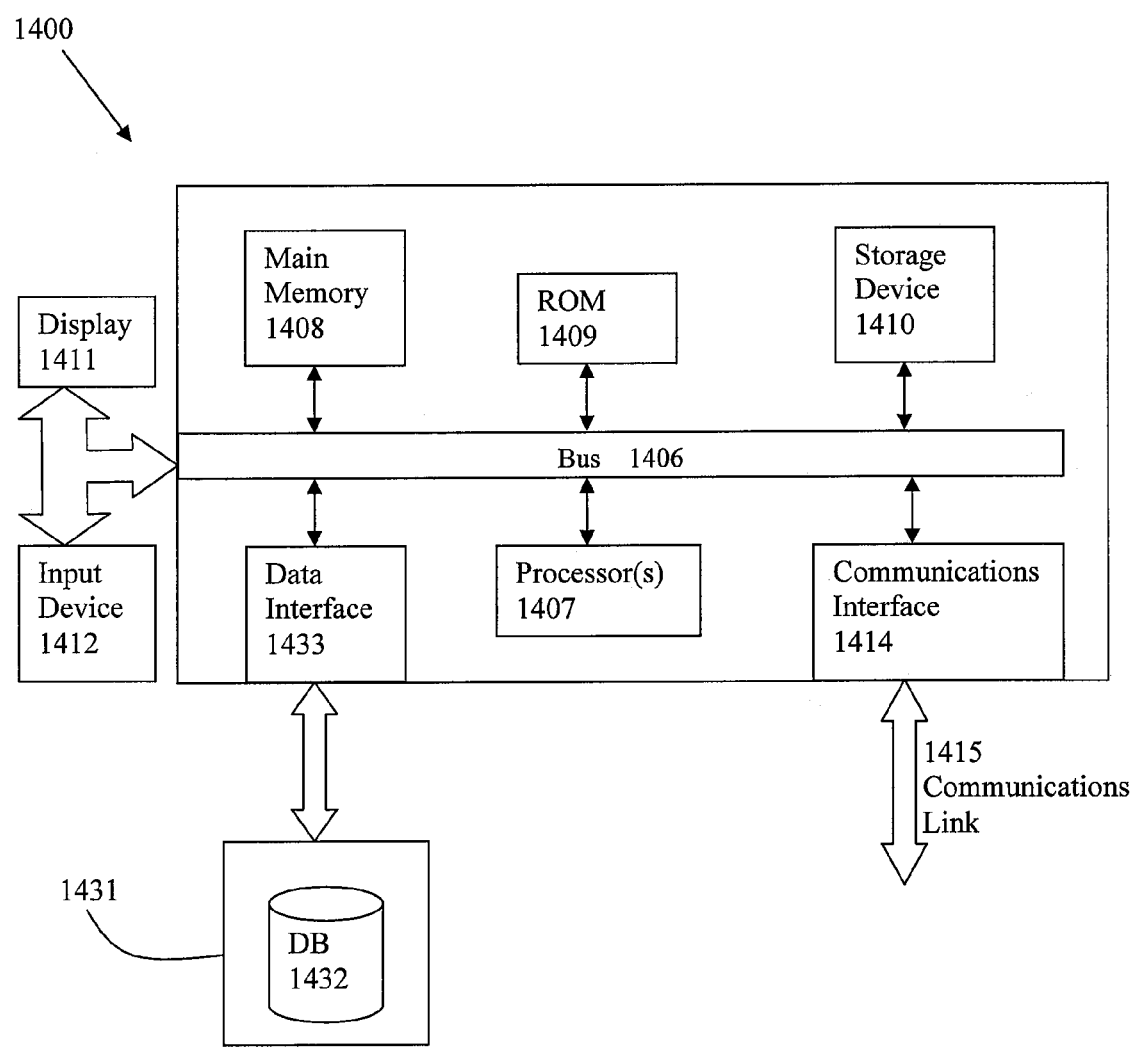
FIG. 7 depicts a computerized system on which a method for preparing multiple levels of semiconductor substrate layers for three-dimensional IC integration.

FIG. 7 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, nonvolatile media and volatile media. Nonvolatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. Computer system 1400 may also interact with a database system 1432 via a data interface 1433 where the computer system 1400 may store and retrieve information or data of the electronic design into and from the database system.

Moreover, the above methods in various embodiments may be implemented using various hardware and software for semiconductor processing. For example, the deposition, removal, patterning, property modification, cleaning, metrology, and image processing processes or techniques may be implemented by using a processing tool comprising an automated cluster semiconductor processing equipment or a semi-automated or even manual stand-alone single cell processing chamber. For example, various cluster tools or single cell processing equipment may be utilized for the physical vapor deposition (PVD), chemical vapor deposition (CVD), atomic layer deposition (ALD), electrochemical deposition or electro-plating (ECD), electroless plating or deposition, auto-catalytic plating or deposition, molecular beam epitaxy (MBE), isotropic or anisotropic wet or dry etching, chemical mechanical polishing (CMP), reflow processes, microlithography, nanolithography, photolithography, electron beam lithography, maskless lithography, nanoimprint lithography, interference lithography, x-ray lithography, extreme ultraviolet lithography, scanning probe lithography, the plasma ashing processes, ion implantation, annealing, oxidation, UVP (ultraviolet light processing), transmission electron microscopy (TEM), scanning electron microscopy (SEM), transmission electron aberration-corrected microscopy, energy filtered TEM, or optical measurement techniques.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A machine implemented method for integrating three-dimensional integrated circuits, comprising:
   using at least a computer system which comprises at least one processor and is programmed for performing:
   identifying an electronic circuit design for an electronic circuit;
   identifying a first concurrent model for a first process or technique for manufacturing a first level of the electronic circuit, the first level comprising a first semiconductor substrate layer, wherein the first concurrent model at least predicts a topographical characteristic of the first level;

identifying a second level of the electronic design, the second level comprising a second semiconductor substrate layer;

identifying a process which causes an insulating dielectric layer (IDL) to be created between the first level and the second level of the electronic circuit;

determining whether the IDL meets a criterion to receive the second level of the electronic circuit by using at least the first concurrent model or a result generated by the first concurrent model for the first level;

determining a location on the IDL for a via or an interconnection connecting the first level and the second level of the electronic circuit; and displaying the electronic circuit design or storing the electronic circuit design in a tangible machine accessible storage non-transitory medium.

2. The machine implemented method of claim 1, further comprising:

determining a process or technique for preparing the second semiconductor substrate layer by analyzing the second semiconductor substrate layer in conjunction with an additional concurrent model for the process or technique.

3. The machine implemented method of claim 2, in which the process or technique for preparing the second semiconductor substrate layer comprises an UV-Cl$_2$ cleaning process, an UV-03 cleaning process, or a planarization process.

4. The machine implemented method of claim 1, in which the determining whether the second semiconductor substrate layer meets a criterion to receive the second level further comprising:

identifying a process which causes the second semiconductor substrate layer to be created between the insulating dielectric layer (IDL) and the second level of the electronic circuit.

5. The machine implemented method of claim 4, in which the second semiconductor substrate layer comprises a polycrystalline silicon layer, a single crystalline silicon layer, or other semiconductor layer.

6. The machine implemented method of claim 4, in which the process comprises CVD low temperature epitaxial growth process, low temperature electron beam or laser induced re-crystallization process of the polysilicon, a metal induced lateral crystallization process, or a low temperature deposition and crystallization of amorphous silicon process.

7. The machine implemented method of claim 1, in which the determining whether the second semiconductor substrate layer meets a criterion further comprises:

determining a buffer layer process which causes a buffer layer to be created atop the second semiconductor substrate layer based upon a concurrent model for the buffer layer process, the buffer layer comprises a germanium layer, a silicon-germanium layer, or an inter-layer dielectric (ILD) layer.

8. The machine implemented method of claim 7, in which the buffer layer process comprises an epitaxial growth process, a deposition process, a dry cleaning process, an UV-Cb cleaning process, or an UV-03 cleaning process.

9. The machine implemented method of claim 7, further comprising:

determining whether the buffer layer meets a second criterion to receive the second level of the electronic circuit, wherein the second criterion comprise a performance, manufacturability, or reliability requirement for the second level of the electronic design or for the electronic design.

10. The machine implemented method of claim 1, in which the determining whether the second semiconductor substrate layer meets a criterion further comprises:

analyzing the second semiconductor substrate layer or an underlying structure of the second semiconductor substrate layer, in which the underlying structure comprises the first level of the electronic circuit or the first semiconductor substrate layer.

11. The machine implemented method of claim 10, in which the analyzing act comprises determining an attribute of a top surface or content of the second semiconductor substrate layer or of its underlying structure.

12. The machine implemented method of claim 11, in which the attribute comprises flatness, roughness, or integrity of the top surface of the second semiconductor substrate layer or composition, species, stress, strain, or bulk property or distribution of species within the second semiconductor substrate layer or within the IDL.

13. The machine implemented method of claim 1, in which the determining whether the second semiconductor substrate layer meets a criterion further comprises:

determining a parameter to cause the second semiconductor substrate layer to be created atop the insulating dielectric layer (IDL).

14. The machine implemented method of claim 1, in which the determining whether the second semiconductor substrate layer meets a criterion comprises:

determining parameter of a process which causes the second semiconductor substrate layer to be created atop the IDL based upon a concurrent model for the process.

15. The machine implemented method of claim 1, in which the identifying a process which causes an insulating dielectric layer to be created comprises:

determining a parameter for a process creating the insulating dielectric layer (IDL) based upon the first concurrent model for the first level of the electronic circuit.

16. The machine implemented method of claim 1, in which the identifying a process which causes an insulating dielectric layer to be created comprises:

analyzing a structure underlying the insulating dielectric layer (IDL), in which the structure comprise the first level of the electronic circuit or the first semiconductor substrate layer.

17. The machine-implemented method of claim 1, in which a portion of the electronic circuit design is generated by context simulation method.

18. The machine-implemented method of claim 1, further comprising:

causing to manufacture a portion of the electronic circuit, in which a design for the portion of the electronic circuit is generated by context simulation method.

19. The machine implemented method of claim 1, further comprising:

determining whether the second semiconductor substrate layer meets a second criterion to receive at least a part of the second level of the electronic circuit by using at least the first concurrent model or a result generated by the first concurrent model for the first level.

20. The machine implemented method of claim 1, further comprising:

causing the second semiconductor substrate layer to be manufactured on the IDL.

21. The machine implemented method of claim 20, the act of causing the second semiconductor substrate comprising:

preparing the IDL for the second semiconductor substrate layer by using at least the first concurrent model or a result generated by the first concurrent model for the first level and one or more additional concurrent models for the IDL or the second semiconductor substrate layer.

22. A system for integrating three-dimensional integrated circuits, comprising:
at least one computer system that comprises at least one processor and is programmed for performing:
identifying an electronic circuit design for an electronic circuit;
identifying a first concurrent model for a first process or technique for manufacturing a first level of the electronic circuit, the first level comprising a first semiconductor substrate layer, wherein the first concurrent model at least predicts a topographical characteristic of the first level;
identifying a second level of the electronic design, the second level comprising a second semiconductor substrate layer;
identifying a process which causes an insulating dielectric layer (IDL) to be created between the first level and the second level of the electronic circuit;
determining whether the IDL meets a criterion to receive the second level of the electronic circuit by using at least the first concurrent model or a result generated by the first concurrent model for the first level;
determining a location on the IDL for a via or an interconnection connecting the first level and the second level of the electronic circuit; and
displaying the electronic circuit design or storing the electronic circuit design in a tangible machine accessible storage non-transitory medium.

23. The system of claim 22, the at least one computer system is further programmed for performing:
determining whether the second semiconductor substrate layer meets a second criterion to receive at least a part of the second level of the electronic circuit by using at least the first concurrent model or a result generated by the first concurrent model for the first level.

24. A computer program product comprising a computer-usable storage non-transitory medium having executable code which, when executed by at least one computer system, causes the at least one computer system to execute a process for integrating three-dimensional integrated circuits, the process comprising:
using at least a computer system which comprises at least one processor and is programmed for performing:
identifying an electronic circuit design for an electronic circuit;
identifying a first concurrent model for a first process or technique for manufacturing a first level of the electronic circuit, the first level comprising a first semiconductor substrate layer, wherein the first concurrent model at least predicts a topographical characteristic of the first level;
identifying a second level of the electronic design, the second level comprising a second semiconductor substrate layer;
identifying a process which causes an insulating dielectric layer (IDL) to be created between the first level and the second level of the electronic circuit;
determining whether the IDL meets a criterion to receive the second level of the electronic circuit by using at least the first concurrent model or a result generated by the first concurrent model for the first level;
determining a location on the IDL for a via or an interconnection connecting the first level and the second level of the electronic circuit; and
displaying the electronic circuit design or storing the electronic circuit design in a tangible machine accessible storage non-transitory medium.

25. The computer program product of claim 24, the process further comprising:
determining whether the second semiconductor substrate layer meets a second criterion to receive at least a part of the second level of the electronic circuit by using at least the first concurrent model or a result generated by the first concurrent model for the first level.

* * * * *